(12) United States Patent
Shiozawa

(10) Patent No.: US 6,897,944 B2
(45) Date of Patent: May 24, 2005

(54) ILLUMINATION OPTICAL SYSTEM, EXPOSURE METHOD AND APPARATUS USING THE SAME

(75) Inventor: Takahisa Shiozawa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/630,012

(22) Filed: Jul. 30, 2003

(65) Prior Publication Data

US 2004/0022068 A1 Feb. 5, 2004

(30) Foreign Application Priority Data

Aug. 5, 2002 (JP) ........................................ 2002-228042

(51) Int. Cl.[7] .......................... G03B 27/54; G03B 27/72
(52) U.S. Cl. ................................................ 355/71; 355/67
(58) Field of Search .............................. 355/46, 53, 67, 355/69, 71; 430/30, 311, 394

(56) References Cited

U.S. PATENT DOCUMENTS

| | | | |
|---|---|---|---|
| 4,682,885 A | | 7/1987 | Torigoe |
| 5,305,054 A | | 4/1994 | Suzuki et al. |
| 5,638,211 A | | 6/1997 | Shiraishi |
| 5,675,401 A | * | 10/1997 | Wangler et al. ................ 355/67 |
| 5,719,704 A | * | 2/1998 | Shiraishi et al. ............. 359/558 |
| 6,078,380 A | | 6/2000 | Taniguchi et al. |
| 6,236,449 B1 | * | 5/2001 | Tanitsu .......................... 355/67 |
| 6,259,512 B1 | * | 7/2001 | Mizouchi ....................... 355/67 |
| 6,285,443 B1 | * | 9/2001 | Wangler et al. ................ 355/67 |
| 6,295,122 B1 | * | 9/2001 | Schultz et al. ................. 355/67 |
| 6,452,662 B2 | * | 9/2002 | Mulkens et al. ............... 355/67 |
| 2002/0085276 A1 | * | 7/2002 | Tanitsu et al. ............... 359/432 |
| 2002/0177048 A1 | | 11/2002 | Saitoh et al. |

FOREIGN PATENT DOCUMENTS

JP      4-78002      12/1992

* cited by examiner

*Primary Examiner*—Rodney Fuller
(74) *Attorney, Agent, or Firm*—Morgan & Finnegan, LLP

(57) ABSTRACT

An illumination optical system for illuminating a mask that arranges a predetermined pattern and an auxiliary pattern smaller than the predetermined pattern using light from a light source includes an illumination-light generating mechanism for dividing the light and for forming a quadrupole light intensity distribution around an optical axis on a predetermined surface that has substantially a Fourier conversion relationship with the mask, so as to resolve the predetermined pattern and restrain the auxiliary pattern from resolving, wherein at least one of a size of each pole of the quadrupole light intensity distribution or a distance between the optical axis and each pole of the quadrupole light intensity distribution are variable.

11 Claims, 20 Drawing Sheets

RESOVED PATTERN    EFFECTIVE LIGHT-SOURCE SHAPE

ILLUMINATION OPTICAL SYSTEM, EXPOSURE METHOD AND APPARATUS USING THE SAME

This application claims the right of priority under 35 U.S.C. §119 based on Japanese Patent Application No. 2002-228042, filed on Aug. 5, 2002, which is hereby incorporated by reference herein in its entirety as if fully set forth herein.

BACKGROUND OF THE INVENTION

The present invention relates generally to illumination optical systems, and more particularly to an illumination optical system used to manufacture devices, such as single crystal plates for semiconductor wafers and glass plates for liquid crystal displays ("LCD"). The present invention is suitable, for example, for an illumination optical system for projection exposure to an object with a contact-hole line pattern or a mixture of isolated contact hole and contact-hole line in a photolithography process.

Recent demands on smaller and thinner profile electronic devices have increasingly demanded finer semiconductor devices to be mounted onto these electronic devices. For example, a design rule has attempted to form a circuit pattern of 100 nm or less on a mass production line, and which will expectedly shift to 80 nm or less. The mainstream photolithography technology has conventionally used a projection exposure apparatus that projects and transfers a pattern on a mask (a reticle) onto a wafer.

Rayleigh equation provides the resolution R of the projection exposure apparatus using a light-source wavelength $\lambda$ and a numerical aperture (NA) of the projection optical system as follows:

$$R = k_1 \times \frac{\lambda}{NA} \quad (1)$$

A focus range that may maintain certain imaging performance is called a depth of focus (DOF), which is defined in the following equation:

$$DOF = k_2 \times \frac{\lambda}{NA^2} \quad (2)$$

Since small DOF makes focusing difficult and thus requires strict flatness and focus accuracy, larger DOF is preferable.

A mask pattern includes an adjacent and periodic line and space (L & S) pattern, an adjacent and periodic contact-hole line that arranges holes at an approximately hole interval, an isolated contact hole that does not have a pair and thus is isolated, other isolated patterns, etc. A pattern transfer with high resolution requires a selection of optimal illumination condition in accordance with pattern types.

The recent semiconductor industry has shifted its production to a highly value-added system chip that mixes a wide variety of patterns. However, the prior art cannot finish exposure such a contact-hole pattern at one time with high resolution, as blends a contact-hole line and an isolated contact hole.

Various methods have been proposed to increase DOF by improving the resolution limit only for a contact-hole line and a longitudinally and laterally periodic wire pattern. These methods include, for example, a double exposure or multi-exposure method that uses two masks to separately expose different types of patterns, an exposure method that uses one mask and special illumination conditions, and a method that provides a mask with various auxiliary patterns to improve the resolving power for a desired pattern.

The above methods commonly require an illumination optical system that serves to freely vary illumination conditions, specifically an effective light-source distribution of the illumination optical system, whenever a size and arrangement of a mask pattern changes according to processes. Disadvantageously, the conventional illumination optical system cannot provide this function, or obtain a high resolution with an optimal illumination condition.

Prior art disclose a switch mechanism from a usual circular effective light source to an annular effective light source, and a switch mechanism to a quadrupole effective light source. Nevertheless, an effective light source needs to vary even in the same type to improve the resolution for future finer patterns.

BRIEF SUMMARY OF THE INVENTION

Accordingly, it is an exemplified object of the present invention to provide an illumination optical system, as well as an exposure method and apparatus having the same, which may provide an optimal effective light-source area or illumination-light shape according to mask-pattern shapes, and relatively vary part of the effective light-source area.

An illumination optical system of one aspect of the present invention for illuminating a mask that arranges a predetermined pattern and an auxiliary pattern smaller than the predetermined pattern using light from a light source includes an illumination-light generating mechanism for dividing the light and for forming a quadrupole light intensity distribution around an optical axis on a surface that has substantially a Fourier conversion relationship with the mask, so as to resolve the predetermined pattern and restrain the auxiliary pattern from resolving, wherein at least one of a size of each pole of the quadrupole light intensity distribution and a distance between the optical axis and each pole of the quadrupole light intensity distribution are variable.

The illumination-light generating mechanism may include a prism. The prism may include pyramid surfaces that arrange a concave surface at an incident surface side and a convex surface at an exit surface side. Alternatively, the illumination-light generating mechanism may include a diffraction optical element.

The illumination-light generating mechanism may include plural optical elements, and a switch mechanism for arranging each optical element on and retreating each optical element from a light path. The illumination optical system may further include an illumination-light deforming mechanism for varying at least one of a size of each pole of the quadrupole light intensity distribution and a distance between the optical axis and each pole of the quadrupole light intensity distribution, wherein the illumination-light deforming mechanism includes plural lenses that have a variable magnification or focal distance. The illumination optical system may further include an illumination-light deforming mechanism for varying at least one of a size of each pole of the quadrupole light intensity distribution and a distance between the optical axis and each pole of the quadrupole light intensity distribution, wherein the illumination-light deforming mechanism includes first and second optical members, and a drive mechanism for relatively moving the first and second optical members in an optical-axis direction. Each of the first and second optical members may be a prism. Each pole of the quadrupole light intensity distribution may have a variable shape.

An exposure apparatus of another aspect of the present invention includes the above illumination optical system for illuminating a mask using light from a light source, and a projection optical system for projecting light from the illumination optical system onto an object to be exposed.

An exposure apparatus of still another aspect of the present invention includes an illumination optical system for illuminating a mask using light from a light source, the mask arranging a predetermined pattern and an auxiliary pattern smaller than the predetermined pattern, and a projection optical system for projecting light from the illumination optical system onto an object to be exposed, the projection optical system including a pupil, wherein the illumination optical system includes an illumination-light generating mechanism for dividing the light and for forming a quadrupole light intensity distribution around an optical axis on a predetermined surface that has substantially a Fourier conversion relationship with the mask, so as to resolve the predetermined pattern and restrain the auxiliary pattern from resolving, wherein a distance between barycenters of two facing poles of the quadrupole light intensity distribution is variable between 0.32 and 0.90 where a diameter of the pupil in the projection optical system is assumed to be 1.

A device fabricating method of still another aspect of the present invention includes the steps of exposing an object using the above exposure apparatus, and performing a predetermined process for the exposed object. Claims for a device fabricating method that performs operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
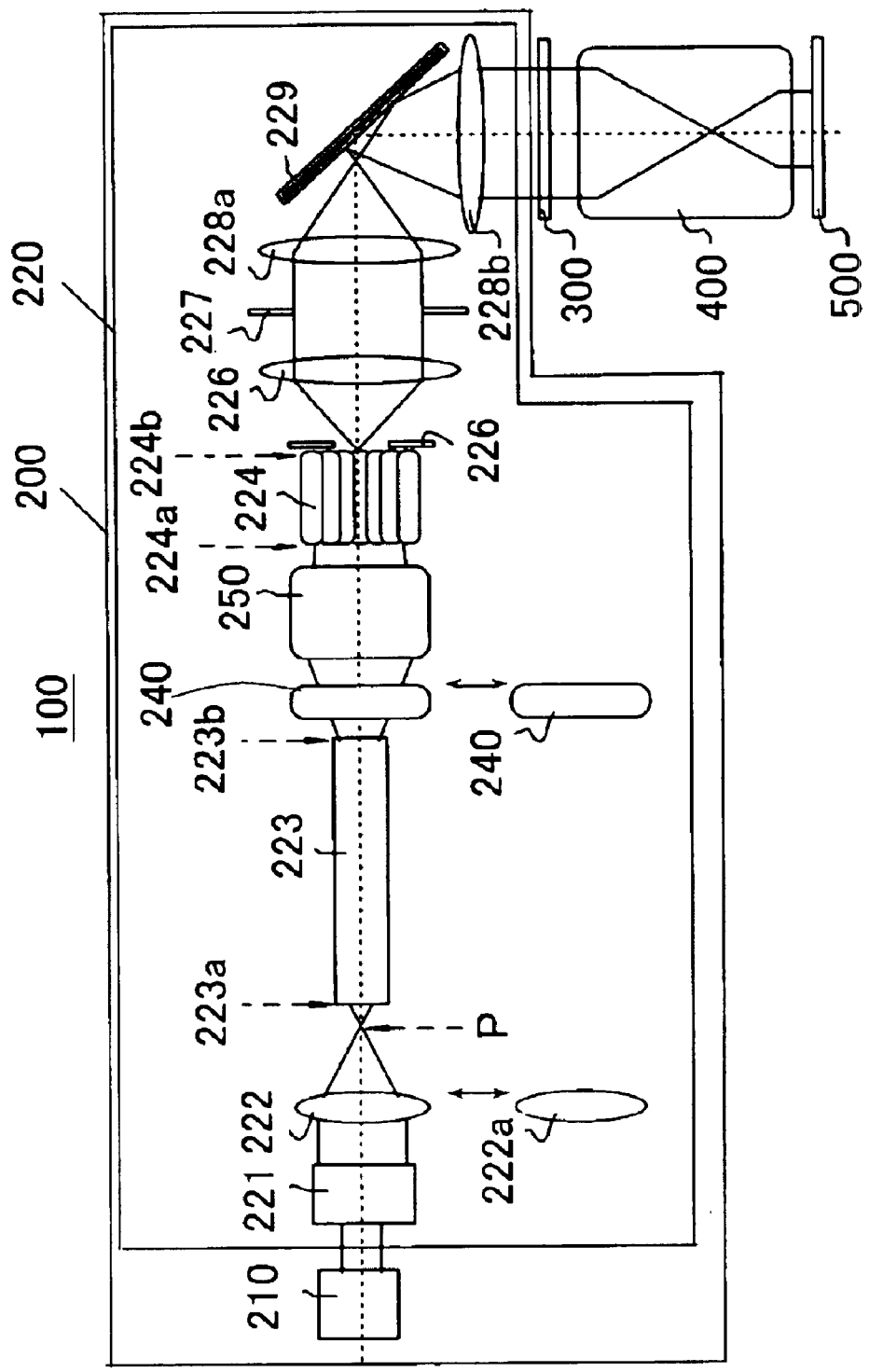
FIG. 1 is a schematic structural view of an exposure apparatus of one embodiment according to the present invention.

Referring now to the accompanying drawings, a description will be now given of an exposure apparatus 1 according to the present invention. The present invention is not limited to these embodiments and each element is replaceable within a scope that achieves the objects of the present invention. The same element in each figure is designated by the same reference numeral, and a description will be omitted.

FIG. 1 is a schematic structural view of an exposure apparatus 100 of one embodiment according to the present invention. As best shown in FIG. 1, the exposure apparatus 100 includes an illumination apparatus 200, a mask 300, a projection optical system 400, and a plate 500.

The exposure apparatus 100 is a projection exposure apparatus that exposes onto the plate 500 a circuit pattern created on the mask 300, for example, in a step-and-repeat or step-and-scan manner. This projection exposure apparatus is suitable for a lithography process of a submicron, quarter-micron or less, and thus a description will be given of a step-and-scan type exposure apparatus (also called as a "scanner") as an example in this embodiment. Here, the "step-and-repeat manner" is one mode of exposure method that moves a wafer stepwise to an exposure area for the next shot every shot of cell projection onto the wafer. The "step-and-scan manner" is another mode of exposure method that exposes a mask pattern onto a wafer by continuously scanning the wafer and the mask relative to the exposure light, and by moving, after a shot of exposure, the wafer stepwise to the next exposure area to be shot.

The illumination apparatus 200 illuminates the mask 300 that forms a circuit pattern to be transferred, and includes a light source section 210 and an illumination optical system 220.

The light source section 210 employs, for example, laser as a light source. Laser may use ArF excimer laser with a wavelength of approximately 193 nm, KrF excimer laser with a wavelength of approximately 248 nm, $F_2$ excimer laser with a wavelength of approximately 157 nm, etc. A type of laser is not limited to excimer laser, and the number of laser units is not limited. The light source section 210 may use extreme ultra violet ("EUV") light with a laser plasma light source. A light source applicable to the light source section 210 is not limited to the laser, but may use one or more lamps such as a mercury lamp, xenon lamp, etc.

The illumination optical system 220 is an optical system that uses light from the light source 210 to illuminates the mask 300 as an object surface, which forms a desired pattern. The illumination optical system 220 includes a beam shaping optical system 221, a condenser optical system 222, an optical pipe or beam mixture means 223, a fly-eye lens 224, a stop member 225, an integrator 224, a stop member 225, an irradiation lens 226, a field stop 227, imaging lenses 228a and 228b, a deflection mirror 229, an illumination-light generating means 240, and an illumination-light deforming means 250 in the instant embodiment.

The illumination light emitted from the light source 210 is converted into a desired beam shape by the beam shaping system 221, and condensed near an incidence surface 223a of the optical pipe 223 by the condenser optical system 222. The condenser optical system 222 is exchangeable with a condenser optical system 222a that has a different exit angle, so as to maintain appropriate a beam angle incident upon the fly-eye lens 224 when the following illumination-light deforming means 250 zooms.

When the optical pipe 223 is made of a glass rod, a condensed point P by the condenser optical system 222 or 222a is defocused from the incidence surface 223a of the optical pipe 223, toward the light source section 210.

The illumination light emitted from the optical pipe 223 passes through the illumination-light generating means 240 and illumination-light deforming means 250, and enters the fly-eye lens 224 as multi-beam generating means. In the instant embodiment, the light quantity or light intensity distribution formed near the exit surface 224b of the fly-eye lens 224 and an aperture shape of the stop member 225, which will be described later, determine an effective light-source distribution, and significantly influence on the imaging performance of the exposure apparatus 100.

A secondary light source or effective light source is formed near the exit surface 224b of the fly-eye lens 224, and the stop member 225 is located there to block unnecessary light and form a desired effective light source. A stop-member drive mechanism (not shown) varies a size and shape of an aperture in the stop member 225.

The irradiation lens 226 superimposes and projects the secondary light sources formed near the exit surface 224b of the fly-eye lens 224, onto the field stop 227. The field stop 227 includes plural movable blocking plates, and defines an illumination area on the mask 300 surface as a target illumination surface.

The imaging lenses 228a and 228b projects an aperture shape of the field stop 227 onto the mask 300 as the target illumination surface through the deflection mirror 229.

A detailed description will be given of the illumination-light generating means 240 and illumination-light deforming means 250.

Figure 2:
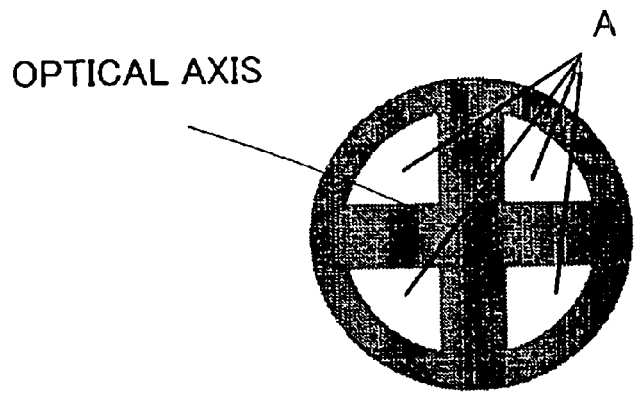
FIG. 2 is a schematic view of quadrupole effective light-source distribution.
Figure 3:
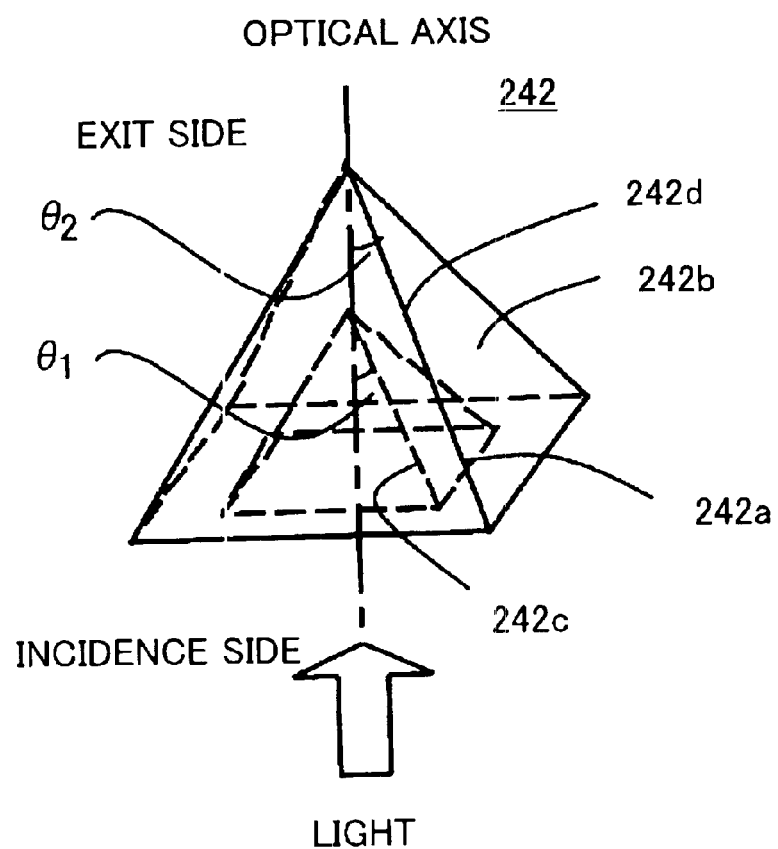
FIG. 3 is a schematic view of a pair of prisms for forming an effective light-source distribution shown in FIG. 2.

The illumination-light generating means 240 includes a modified-illumination forming element 242 as a transmitting member for converting light from the optical pipe 223 into a quadrupolar or annual shape according to illumination conditions, such as quadrupole illumination and annular illumination. In order to form a well-known effective light-source distribution or light intensity distribution including quadrupole luminous parts A around an optical axis, as shown in FIG. 2, the modified-illumination forming element 242 uses a prism 242 as shown in FIG. 3, which provides a concave pyramid surface or plane 242a at an incident side or surface, and a convex pyramid surface 242b at an exit side or surface. Angles $\theta_1$ and $\theta_2$ between edges 242c and 242d of the pyramid on the incident and exit surfaces and optical axis may be equal or different in order to improve the illumination efficiency or vary the quadrupole luminous area or part A in FIG. 2. Here, FIG. 2 is a schematic view of quadrupole effective light-source distribution, and FIG. 3 is a schematic view of a pair of prisms for forming the effective light-source distribution shown in FIG. 2.

The illumination-light generating means 240 forms a quadrupole effective light-source distribution around an optical axis in the instant embodiment. The effective light-source distribution formed by the illumination-light generating means 240 is not limited to a quadrupole shape, but may having a quit-pole shape effective light-source shape that has an additional effective light-source shape at the center in addition to the quadrupole shape by flattening a vertex of the prism 242, or annular light-source distribution by using a cone prism.

While FIG. 2 shows an exemplary quadrupole distribution that arranges four poles diagonally on the paper surface, the quadrupole distribution may arrange four poles, for example, in the longitudinal and lateral directions on the paper by making the prism 242 freely rotatable around the optical axis.

A proper stop member may be arranged near the prism 242 to shape each pole of the quadrupole distribution into an approximately circular shape.

Figure 4:
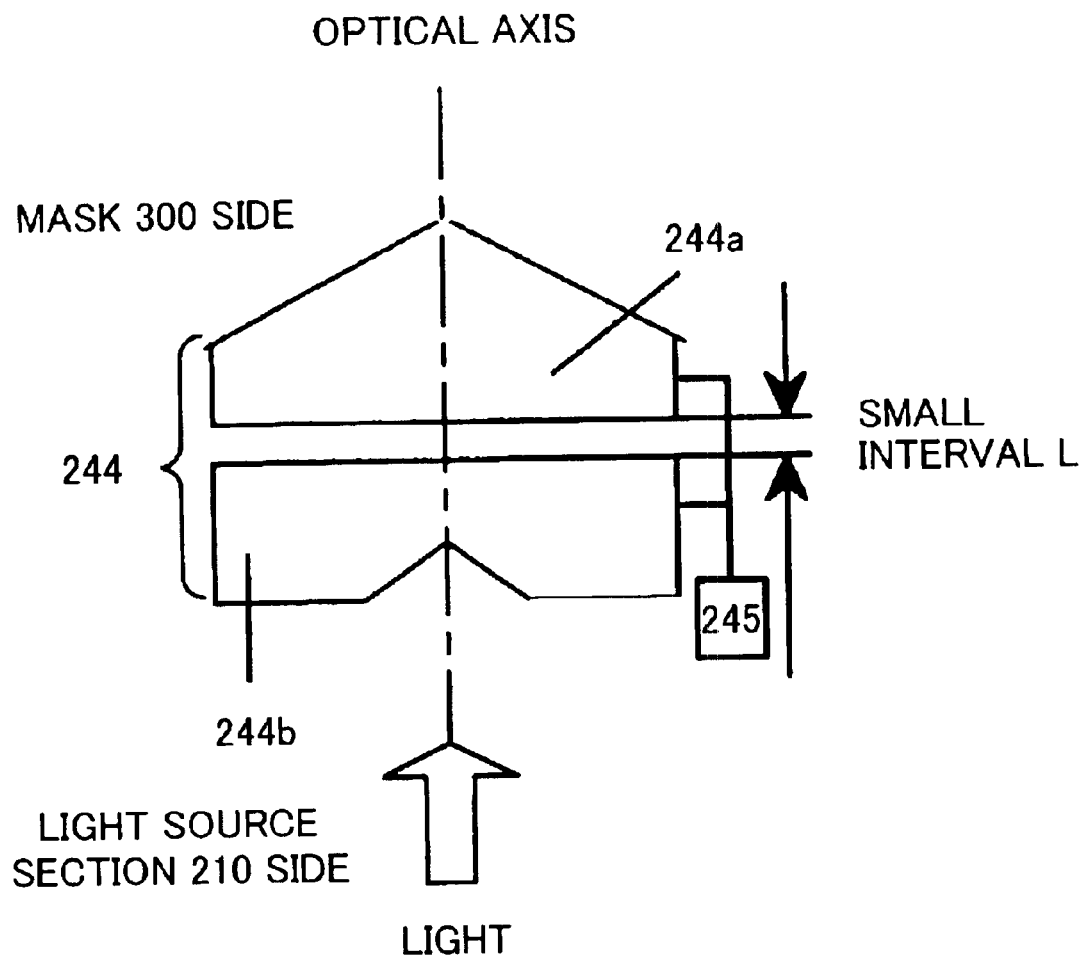
FIG. 4 is a schematic view of a pair of prisms for forming an effective light-source distribution shown in FIG. 2.
Figure 5:
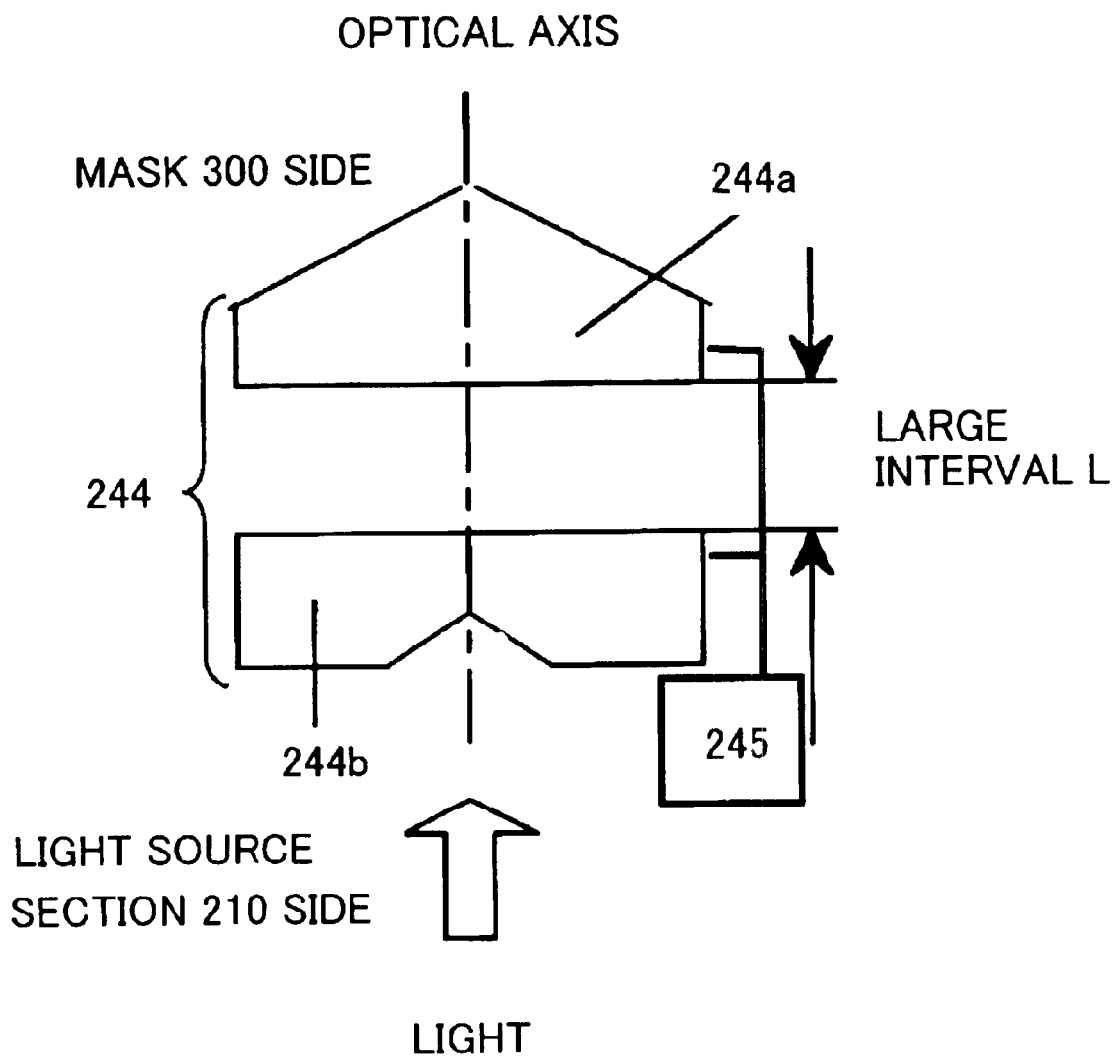
FIG. 5 is a schematic view of a pair of prisms for forming an effective light-source distribution shown in FIG. 2.

The illumination-light generating means 240 includes, as shown in FIGS. 4 and 5, a pair of prisms 244, i.e., a convex pyramid prism 244a and a concave pyramid prism 244b), and a drive means 245 for relatively driving these prisms 244a and 244b in an optical-axis direction to form a variety of effective light-source distributions. FIGS. 4 and 5 are schematic views showing a pair of prisms 244 for forming the effective-light source distribution shown in FIG. 2, wherein FIG. 4 shows a small interval L between the pair of prisms 244, while FIG. 5 shows a large interval L between them.

Figure 6:
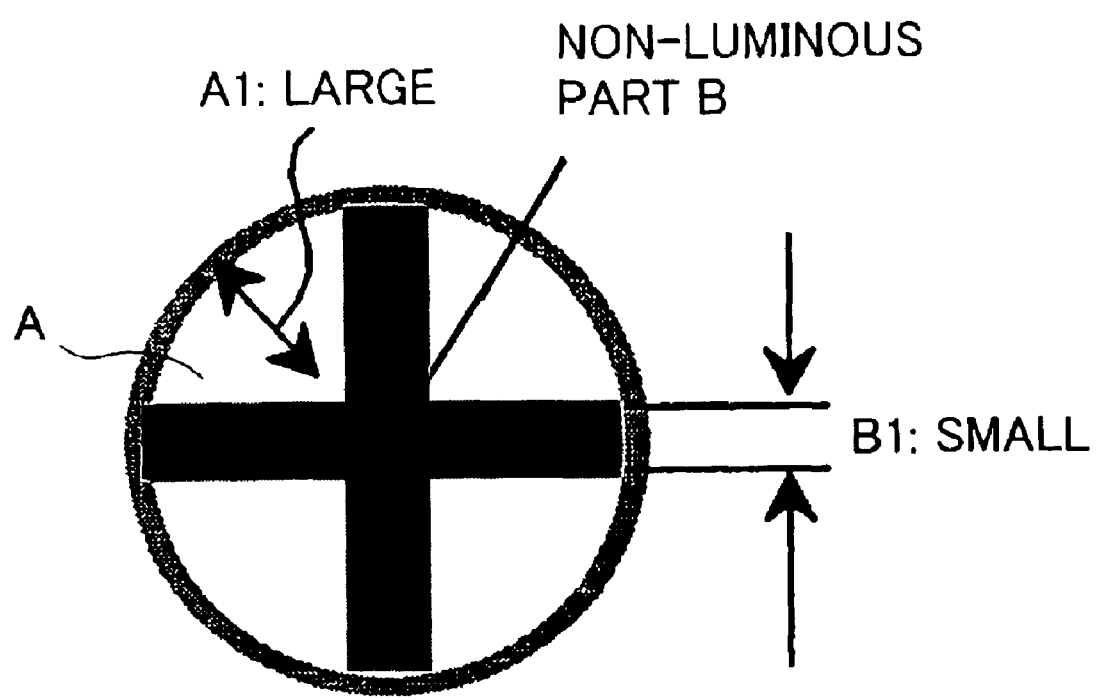
FIG. 6 is a schematic view of a relationship between an interval between the pair of prisms shown in FIG. 4 and a formed effective light-source shape.

Referring to FIG. 4, the quadrupole effective light-source distribution has a long length A1 of the quadrupole luminous part A and a narrow width B1 of the non-luminous part B for the small interval L between the pair of prisms 244. FIG. 6 is a schematic view showing a relationship an interval between the pair of prisms 244 shown in FIG. 4 and a formed effective light-source shape.

Figure 7:
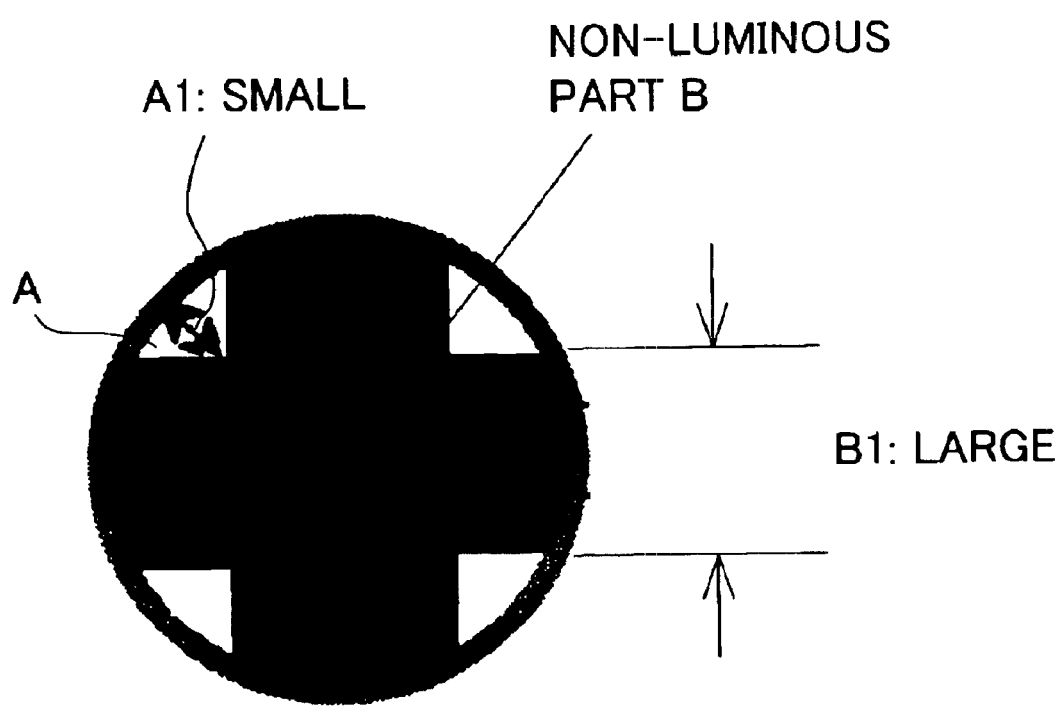
FIG. 7 is a schematic view of a relationship between an interval between the pair of prisms shown in FIG. 5 and a formed effective light-source shape.

Referring to FIG. 5, the quadrupole effective light-source distribution has a short length A1 of the quadrupole luminous part A and a wide width B1 of the non-luminous part B for the large interval L between the pair of prisms 244. FIG. 7 is a schematic view showing a relationship an interval between the pair of prisms 244 shown in FIG. 5 and a formed effective light-source shape.

Therefore, a relative ratio, light quantity ratio or size ratio between the effective luminous part A and non-luminous part B is adjustable according to patterns on the mask 300.

A combination with the following illumination-light deforming means 250 may adjust a size of the effective light-source distribution or value σ while maintaining a relative ratio between the luminous part A and non-luminous part B.

In other words, the above combination may freely adjust a size and position (or distance from the light source) of the quadrupole distribution.

As shown in FIGS. 4 and 5, the prism 244b at the side of the light source section 210 arranges a concave tetrahedron at its incidence side and a flat surface at its exit side, while the prism 244a at the side of the mask 300 arranges a flat surface at its incidence side, and a convex tetrahedron at its exit side. Of course, the prism 244b may arrange a flat surface at its incidence side and a concave tetrahedron at its exit side, while the prism 244a may arrange a convex tetrahedron at its incidence side and a flat surface at its exit side. However, the structure shown in FIGS. 4 and 5 is preferable when different shapes are arranged close to each other to form one prism.

Figure 8:
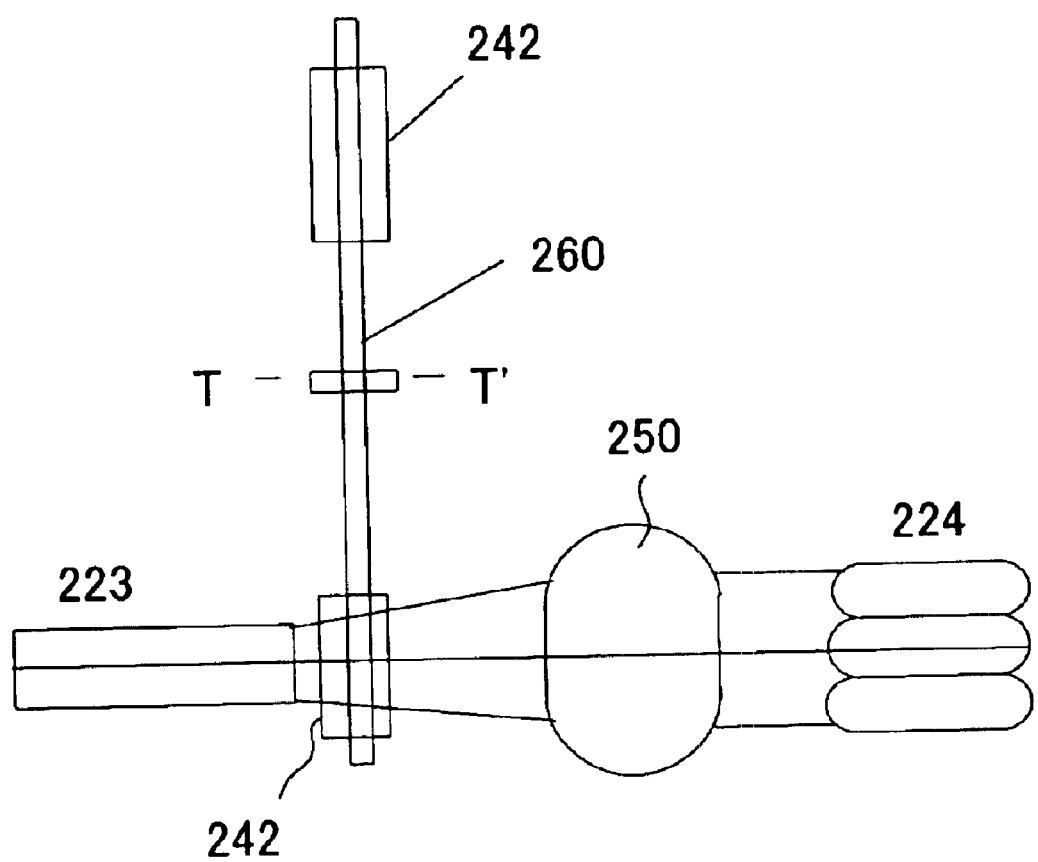
FIG. 8 is an enlarged view of principal part of an illumination optical system that includes a switch means for switching plural modified-illumination forming elements.

The illumination-light generating means 240 may include, as shown in FIG. 8, switch means 260 for switching plural modified-illumination forming elements 242. FIG. 8 is an enlarged structural view of principal part of the illumination optical system 220 that has the switch means 260.

Figure 9:
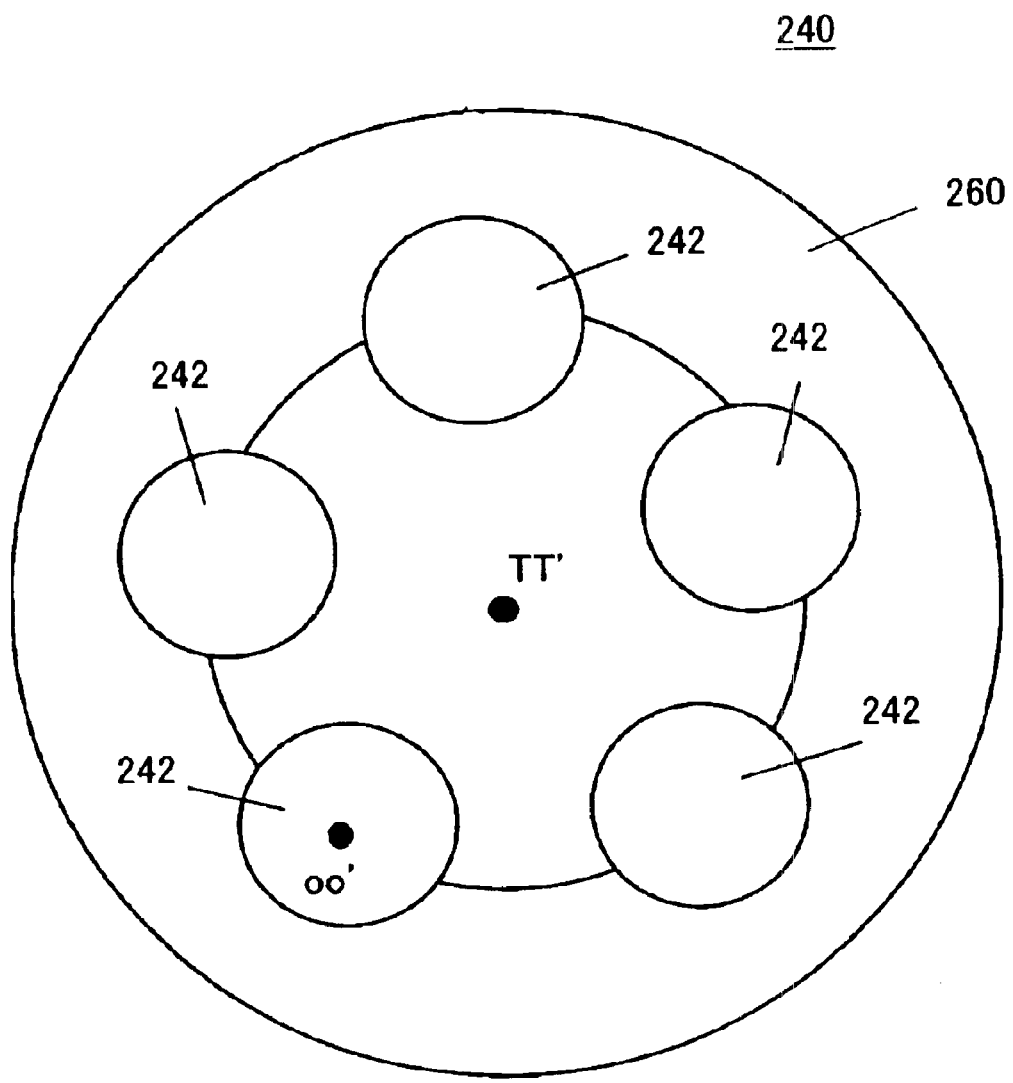
FIG. 9 is a plane view of an exemplary illumination-light generating means that includes the switch means and modified-illumination forming elements.

The switch means 260 has a turret shape as shown in FIG. 9, and arranges plural modified-illumination forming elements 242 around a rotation center T–T'. A plurality of plural modified-illumination forming elements 242 may include the above prism 242, the following diffraction optical element 246, or a zooming means for making part of the effective light source variable. Each element may have no zooming means, fix the effective light-source distribution, but be mutually switched to provide the turret with a partial zooming function.

Figure 10:
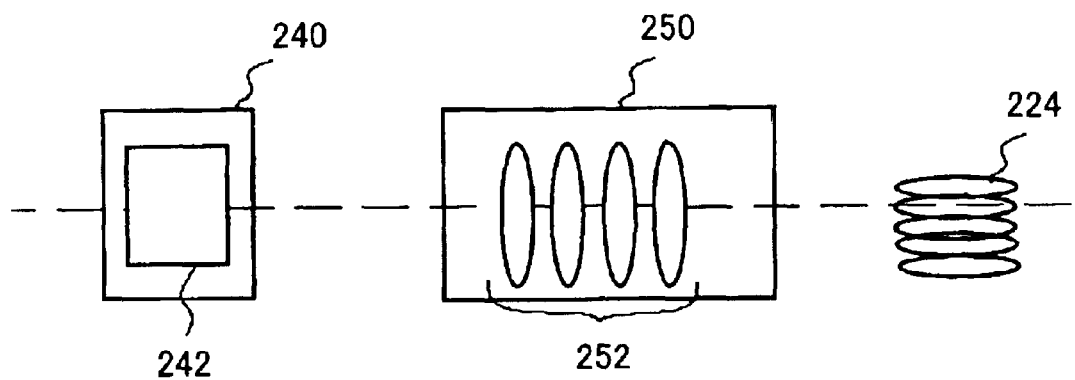
FIG. 10 is an enlarged structural view of principal part of the illumination optical system shown in FIG. 1.

The illumination-light deforming means 250 condenses light from the exit surface 223b of the optical pipe 223 onto the incidence surface 224a of the fly-eye lens 224, and adjusts a size of the effective light-source distribution or light intensity distribution formed by the illumination-light generating means 240. The illumination-light generating means 250 includes, as shown in FIG. 10, for example, plural zoom lenses 252 for projecting an effective light-source distribution formed by the illumination-light generating means 240 onto the incidence surface 224a of the fly-eye lens 224 with a predetermined magnification, to arrange them optically conjugate with each other. Here, FIG. 10 is an enlarged structural view of principal part of the illumination optical system 220 shown in FIG. 1. The illumination-light generating means 250 varies a size of the quadrupolar luminance part or area A shown in FIG. 2 formed by the illumination-light generating means 240. A proper selection of the zoom lens 252 in the illumination-light deforming means 250 would thus optimize a size of the effective light-source distribution or a size of the luminous part A according to patterns formed on the mask 300. When the illumination-light generating means 250 includes plural zoom lenses 252 movable through a drive mechanism (not shown) along the optical axis, an interval between these zoom lenses 252 may be varied, and a beam area incident upon onto the fly-eye lens 224 may be adjusted to form plural illumination conditions. The illumination-light deforming means 250 may serve to deform each beam divided by the illumination-light generating means 240 or part of the quadrupole effective light source, instead of deforming the entire quadrupole effective light-source distribution.

The illumination-light deforming means 250 may change a distance between the optical axis and the effective light-source distribution or light intensity distribution formed by the illumination-light generating means. The instant embodiment changes an interval between the optical axis and the quadrupolar luminous part or area A shown in FIG. 2.

Since the illumination-light generating means 240 and illumination-light deforming means 250 may thus optimize a size and shape of the effective light-source distribution, and a distance between the optical axis and the effective light-source distribution, the instant embodiment may arbitrarily set the quadrupole luminous part A and non-luminous part B shown in FIG. 2.

While the above embodiment arranges the illumination generating means 240 between the optical pipe 223 and the fly-eye lens 224, the second fly-eye lens 324 may be used instead of the optical pipe 223 with the illumination-light generating means 240 arranged between the second fly-eye lens 324 and the fly-eye lens 224.

Figure 11:
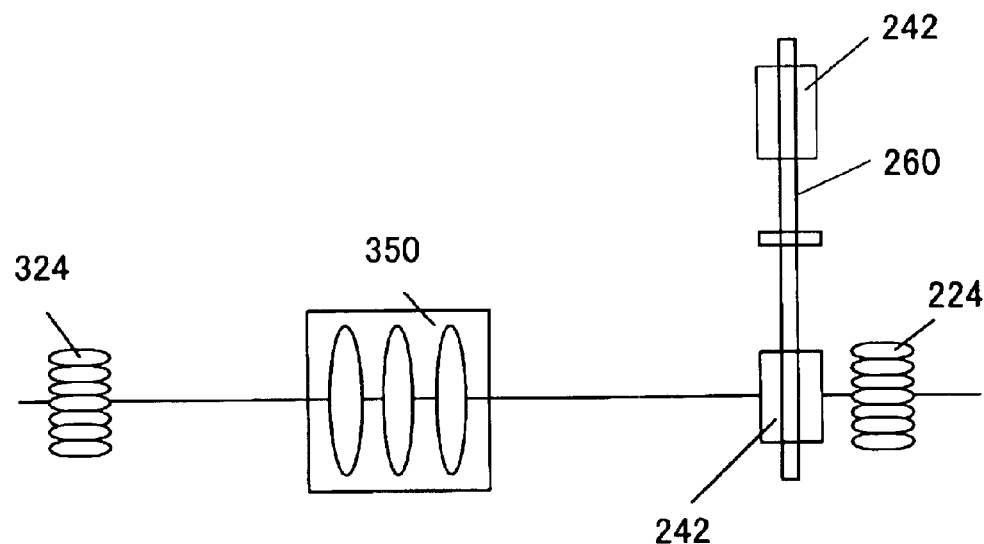
FIG. 11 is a view of an exemplary arrangement of the illumination optical system that uses a second fly-eye lens.

FIG. 11 shows an embodiment that uses the second fly-eye lens 324. While the intervenient optical system 250 is a zoom imaging lens in the embodiment that uses the optical pipe 223, the intervenient optical system 350 between two fly-eye lenses in the instant embodiment Koehler-illuminates the incidence surface of the fly-eye lens 224 using light from plural light-source images formed at the back side of the second fly-eye lens 324, and is a zoom lens that may vary its focal distance to change a size of the distribution on the incidence surface of the fly-eye lens 224.

This embodiment arranges the illumination-light forming means 240 that includes a prism, etc. near or at a position optically conjugate with the incidence surface of the fly-eye lens 224.

The illumination-light generating means 240 that includes a diffraction optical element 246 would be able to provide a wide variety of effective light-source shapes. The diffraction optical element 246 serves to diffract perpendicularly incident light in a desired direction.

The diffraction optical element 246 is manufactured as a binary optics ("BO") or manufactured using technology of computer generated hologram ("CGH"). Therefore, any effective light-source shape may be easily manufactured according to patterns formed on the mask 300 within a permissible range of fine processing, i.e., within a permissible range of forming a phase distribution that provides functions of the diffraction optical element.

Figure 12:
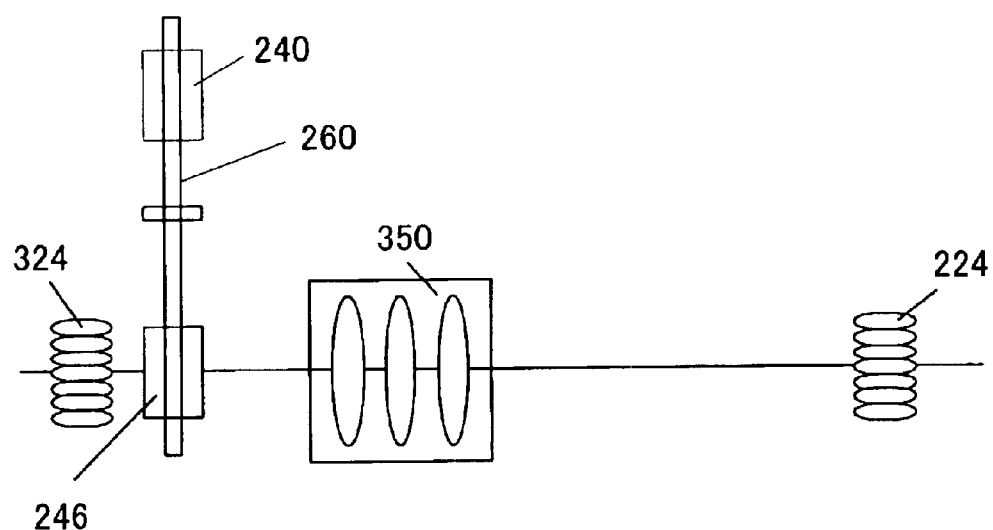
FIG. 12 is a view of an exemplary arrangement of the illumination optical system that uses a diffraction optical element.

FIG. 12 is an exemplary optical system that uses the diffraction optical element 246. The diffraction optical element is arranged near a position that has an optically Fourier conversion relationship with an incident surface 224a of the fly-eye lens 224, or near a back focus position of the second fly-eye lens 324 in FIG. 12. Strictly speaking, it is preferable to arrange the diffraction optical element 246 behind the back focus position of the second fly-eye lens 324 at a predetermined distance from several millimeters to a dozen of millimeters in view of durability and diffraction effect of the diffraction optical element. When the switch means selects one of plural diffraction optical elements and arranges it on the optical path, a desired light intensity distribution may be at the incident surface 224a of the fly-eye lens 224. Of course, the illumination may follow after the diffraction optical element retreats.

Figure 13A:
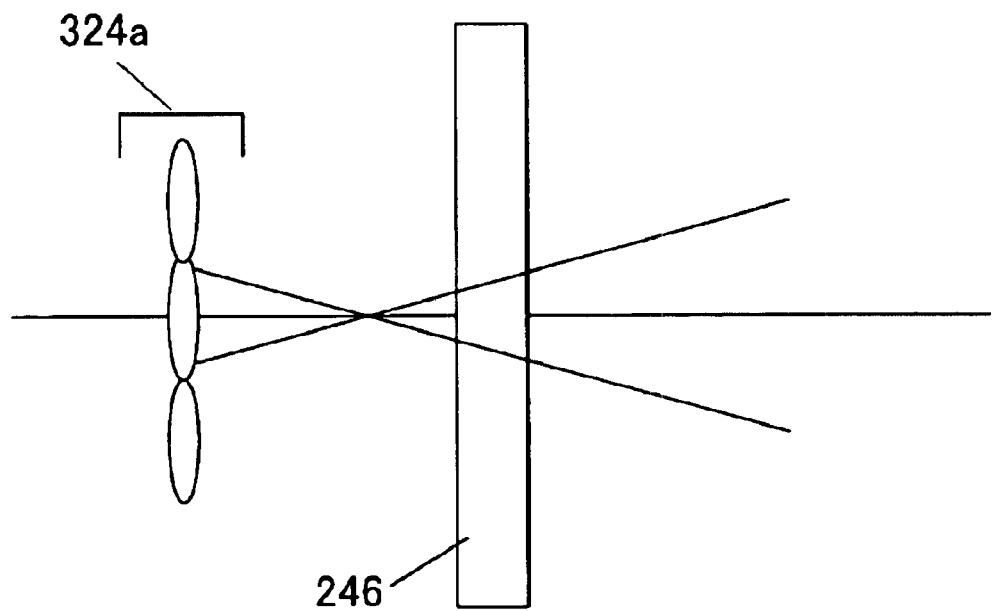
FIG. 13 is a view of an exemplary arrangement between the second fly-eye lens and diffraction optical element.
Figure 13B:
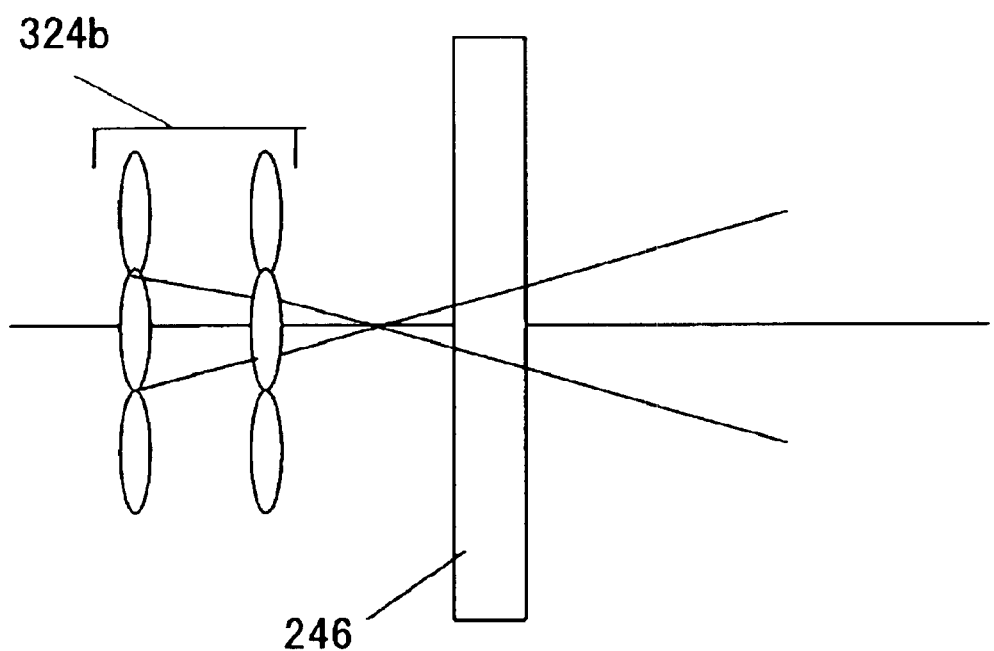

Each lens in the second fly-eye lens 324 in using the diffraction optical element preferably forms an optical system, such as a fly-eye lens 324b in FIG. 13B, whose front or incident focal point surface approximately accords with its incident surface, instead of a thin single lens 324a as shown in FIG. 13A. Of course, it may be a thick single lens or a combination of plural cylindrical lenses, such as a two sets of cylindrical lenses disclosed in Japanese Patent Publication No. 4-78002, as long as it meets the above requirements. Such a structure would maintain uniform the light angle incident upon the diffraction optical element 246 and the distribution at the incident surface 224a of the fly-eye lens 224 does not change accordingly, even when a light angle incident upon the second fly-eye lens 324 changes.

The light distribution at the incident surface 224a of the fly-eye lens 224 in the optical system that uses the above diffraction optical element determines its shape according to exit angle distributions of the second fly-eye lens 324 and the diffraction patterns of the diffraction optical element, and determines the size according to focal distances of the zoom lens 350.

For example, the second fly-eye lens that includes a combination of plural cylindrical lenses provides a rectangular exit angle distribution. Therefore, formed at the incident surface 224a of the fly-eye lens 224 is a distribution that blurs the original diffraction pattern of the diffraction optical element or a diffraction pattern from perpendicularly incident light due to a rectangular angular distribution. The diffraction pattern of the diffraction optical element should be such a pattern that the light intensity distribution on the incident surface 224a of the fly-eye lens 224 becomes the desired shape taking the incident angle distribution into account. Of course, the second fly-eye lens may be switched to another element that has a different exit angular distribution in order to change the light intensity distribution on the incident surface 224a of the fly-eye lens 224.

When the illumination optical system 220 that forms an effective light-source distribution including the luminous parts A and non-luminous part B illuminates the predetermined mask that arranges the desired pattern and auxiliary pattern, the improved resolution limit of contact-hole lines and the longitudinal and lateral repetitive wire pattern and increased DOF are available, as detailed below.

Figure 14:
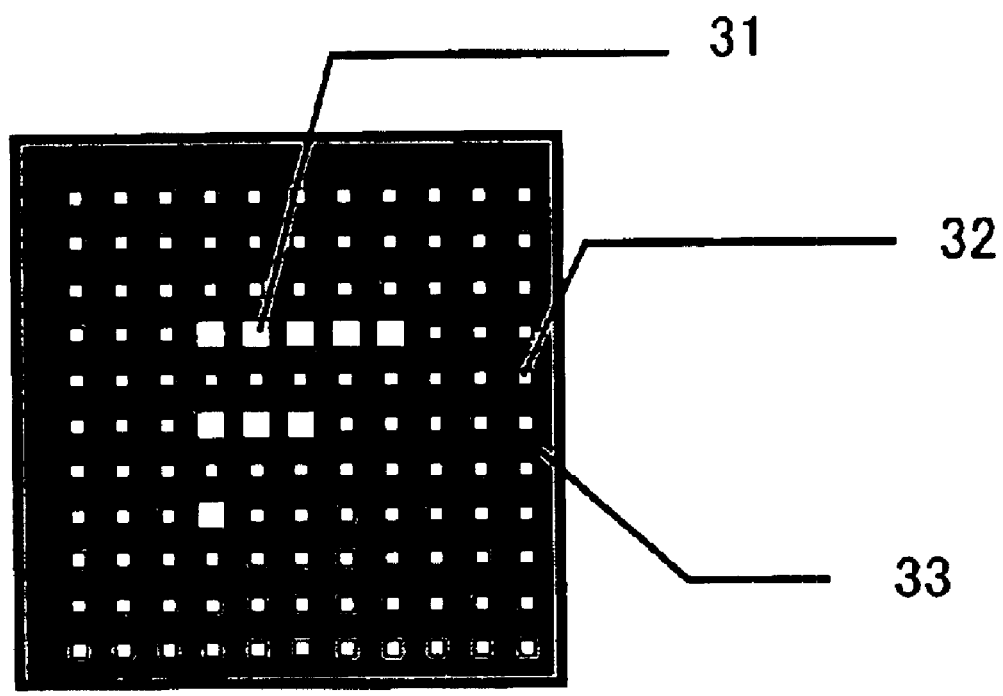
FIG. 14 is a schematic view of a binary mask that forms a desired contact-hole pattern and an auxiliary pattern.

The mask 300 shown in FIG. 1 may use a mask 300a shown in FIG. 14 that arranged a desired contact-hole pattern at a certain pitch and an auxiliary or dummy pattern around the desired pattern. Here, FIG. 14 is a schematic view of a binary mask that forms a desired contact-hole pattern and an auxiliary pattern. The mask shown in FIG. 14 uses light transmitting part including the desired contact-hole pattern 31 and auxiliary pattern 32, and light blocking part 33. The contact-hole pattern 31 and auxiliary pattern 32 form a two-dimensional contact-hole lines arranged with a pitch $P_0=2P$ in longitudinal and lateral directions where P is a hole diameter.

As discussed in detail below, only the desired contact-hole pattern may be exposed with good resolving power onto the plate 500, by illuminating this mask 300a using cross oblique incidence illumination (referred to as enhancement illumination part) to resolve the desired contact-hole pattern, and illumination (referred to as restraint illumination part) to restrain the dummy resolution by the cross oblique incidence illumination (in other words, to limit the exposure dose for the dummy resolution pattern (a little increased exposure dose) and to enhance the exposure dose for the desired contact-hole pattern (much increased exposure dose)).

Figure 15A:
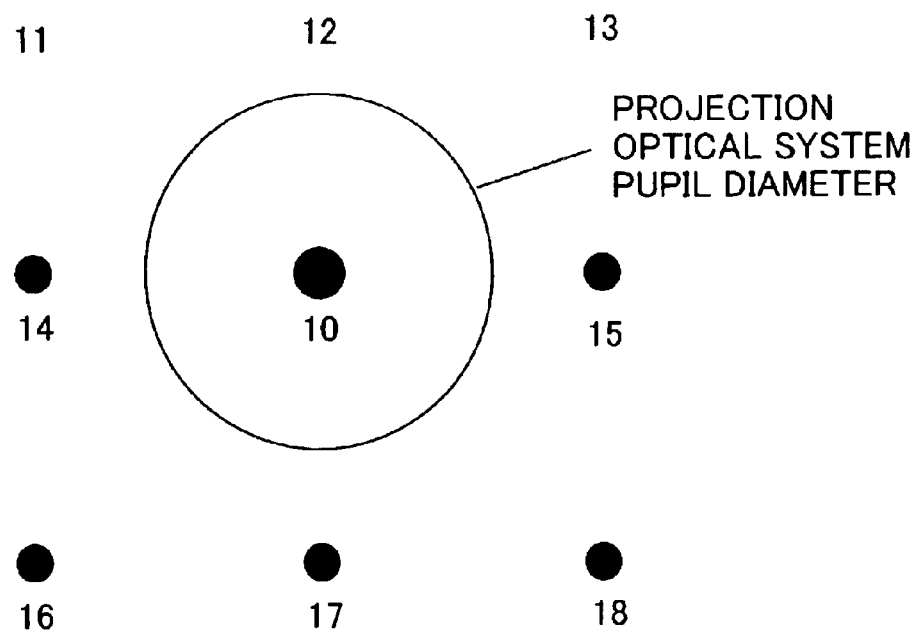
FIG. 15 is a schematic view showing positions of diffracted beams on a pupil surface for small σ illumination to a binary mask shown in FIG. 14, and moving positions of diffracted beams for oblique incidence illumination.

When the mask 300a shown in FIG. 14 that has a small pitch in the contact holes is illuminated with small σ illumination, diffracted beams deviate from the pupil surface in the projection optical system 400 except for the $0^{th}$ order diffracted beam. More specifically, there occur the $0^{th}$ order diffracted beam 410 and diffracted beams 11–18 of other orders as shown in FIG. 15, and diffracted beams except for the $0^{th}$ order diffracted beam deviate from the pupil surface, forming no pattern under this condition. Here, FIG. 15A is a schematic view showing positions of diffracted beams on a pupil surface for small σ illumination to the mask 300a shown in FIG. 14, and moving positions of diffracted beams for oblique incidence illumination.

Figure 15B:
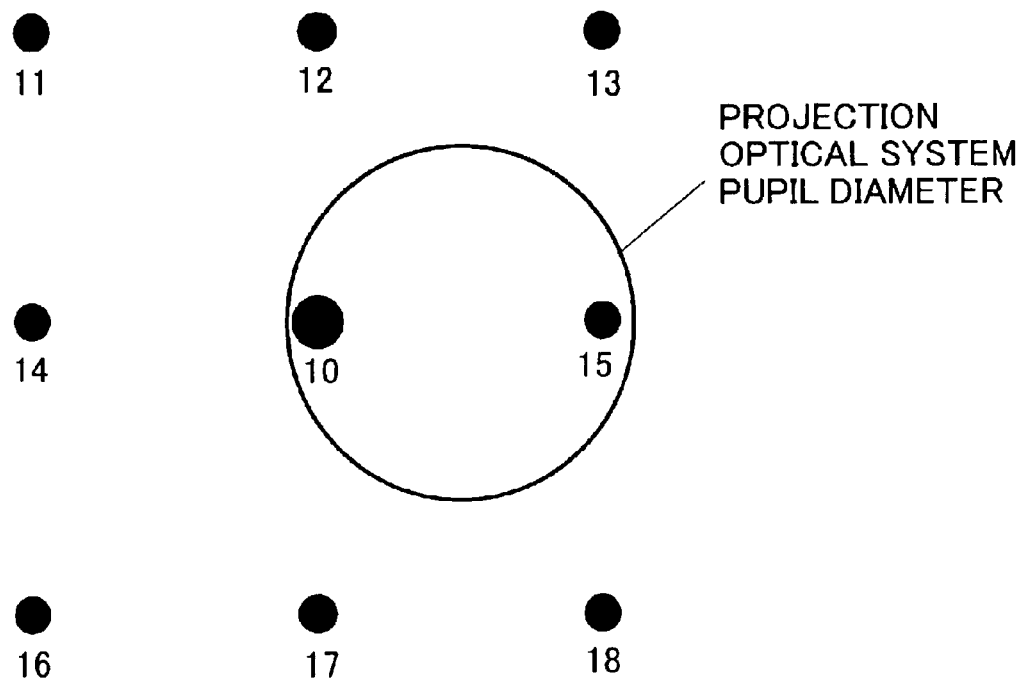

Therefore, illumination is required to allow the diffracted beams 11–18 to enter the pupil. For example, in order to illustratively allow illustrative two diffracted beams 10 and 15 to enter the bevel area on the pupil surface in the projection optical system 400 shown in FIG. 15A, the $0^{th}$ order light 10 may be moved to form oblique incidence illumination as shown in FIG. 15B. This oblique incidence illumination enables one of the diffracted beams 10 and 15 to enter both ends in the pupil in the projection optical system 400, and interference between them forms linear interference bands at a regular pitch on the plate 500.

Figure 16:
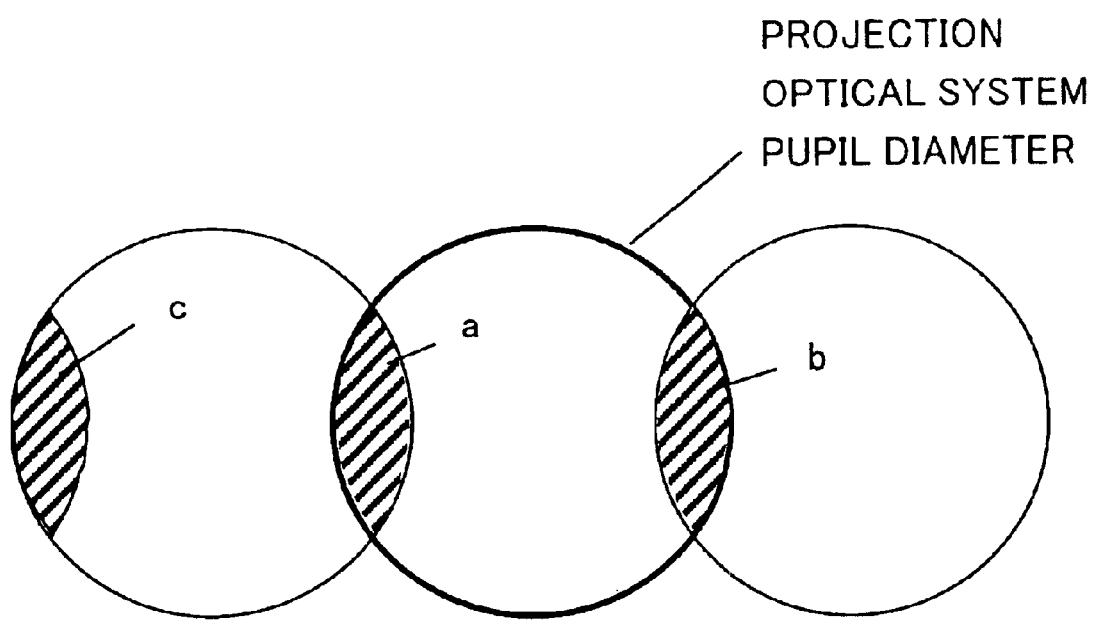
FIG. 16 is a view showing a relationship between $0^{th}$ order and $1^{st}$ order beams for oblique incidence illumination to a certain fine pitch pattern.

FIG. 16 shows a relationship between the $0^{th}$ order diffracted beam and the $1^{st}$ order diffracted beams in oblique incidence illumination for a mask pattern with fine pitches. For area "a" of the $0^{th}$ order diffracted beam, $\pm 1^{st}$ order diffracted beams occur like "b" and "c". In FIG. 16, a shape of the area "a" allows one of $\pm 1^{st}$ order diffracted beams to enter the pupil. Left and right circles of the pupil in the projection optical system have the same diameter as the pupil diameter in the projection optical system, and their centers are offset from the center of the pupil by a predetermined amount (or an interval between 10 and 15 in FIG. 15). In other words, the oblique incidence illumination that arranges the $0^{th}$ order diffracted beam in the area "a" enables one of $\pm 1^{st}$ order diffracted beams to enter the pupil, and interference between these two diffracted beams forms linear interference bands at a regular pitch on the object.

Similarly, the oblique incidence illumination that arranges the $0^{th}$ order diffracted beam in the area "b" enables one of $\pm 1^{st}$ order diffracted beams 15 to enter the pupil in the area "a".

Figure 17:
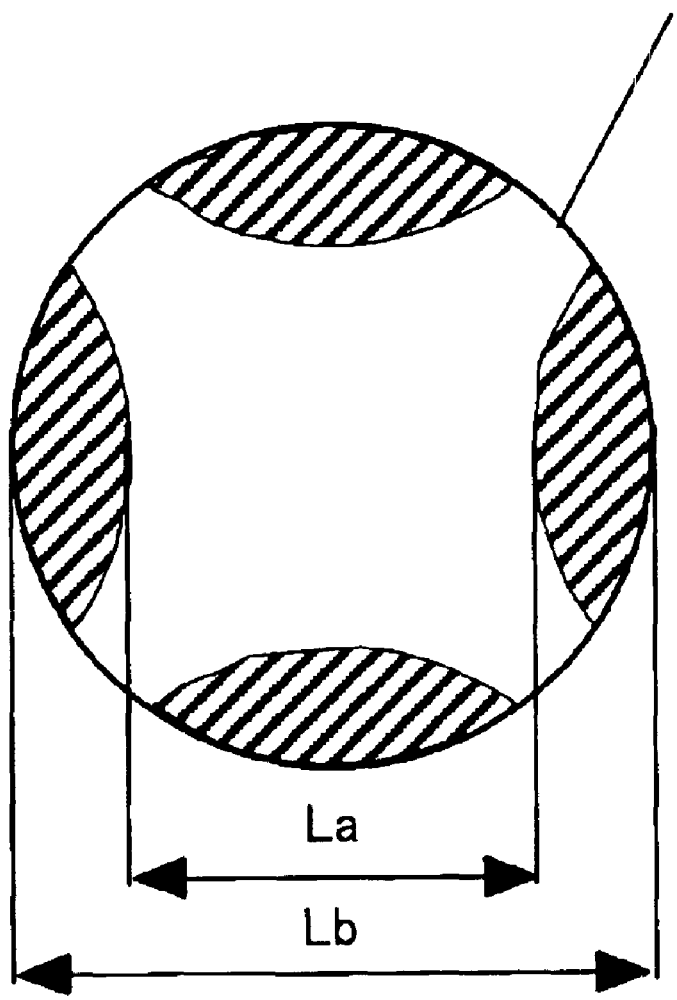
FIG. 17 is a view that combines four streamlined effective light-source areas (or $0^{th}$ order beam areas) as partial overlap of two circles.

As shown in FIG. 17, four streamlined effective light-source areas as a combination area of two circles would form linear infringe bands on the plate 500 at a regular pitch in longitudinal and lateral directions, and strong and weak parts appear at two-dimensional pitches at intersection points overlapping light intensity distributions. In other words, the above enhancement illumination part corresponds to four (beveled) streamlined areas having a longitudinal direction in a direction perpendicular to a radial direction of crossed pupil as shown in FIG. 17. The other part (i.e., part other than beveled part in the pupil in the projection optical system) corresponds to the above restraint illumination part.

A position of the enhancement illumination part for the pitch $P_0$ in the mask pattern is given by the following equations:

$$Lb=1, \quad La+Lb=\lambda/(P_0 \times NA_0) \tag{3}$$

In other words, $La=\lambda/(P_0 \times NA_0)-1$ where La is an interval between inner sides of two facing enhancement illumination parts, Lb is an interval between outer sides of two facing enhancement illumination parts shown in FIG. 15 (σ conversion or a value when a pupil diameter of the projection optical system is 1), $NA_0$ is NA of the projection optical system 400, and λ is an exposure wavelength.

Here, La should meet 0<La<1 to enable only one diffracted beam to enter the pupil in addition to the $0^{th}$ order beam.

From Equation 1, the resolution R of the projection optical system 400, which is half the pattern pitch $P_0$, is expressed as $R=k_1\times\lambda/NA$. The principle limit of the resolving power R occurs when the $0^{th}$ order light and $1^{st}$ order light face at peripherals in the pupil surface in the projection optical system and $k_1=0.25$. The annular illumination may comparatively easily resolve a pattern width with $k_1$ is larger than about 0.38, and thus saves an application of a combination of the auxiliary pattern with the oblique incidence illumination unlike the present invention. The present invention attempts to resolve a pattern width of $k_1$ smaller than about 0.38, which corresponds to a pattern width equal to or smaller than about 120 nm for NA=0.80 and KrF laser with a exposure light wavelength of 248 nm.

La corresponding to a pattern width equal to or smaller than about 0.38 is 0.32 or larger from Equation 3 and $k_1=R\times NA_0/\lambda=P_0\times NA_0/2\lambda$, or $\lambda/(P_0\times NA_0)=\frac{1}{2}k_1$.

Figure 18A:
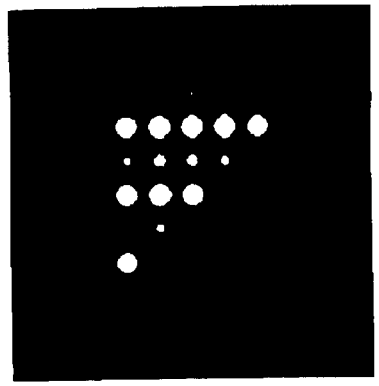
FIG. 18 is a view of simulated resolution pattern on an object to be exposed.
Figure 18A:
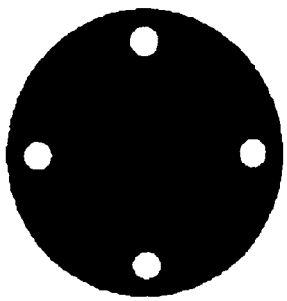
Figure 18B:
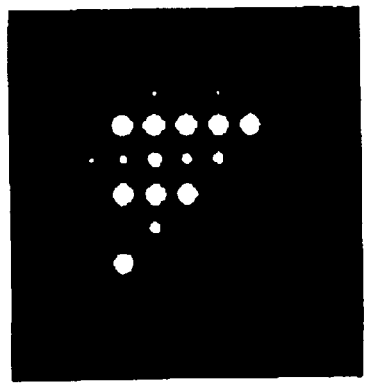
Figure 18B:
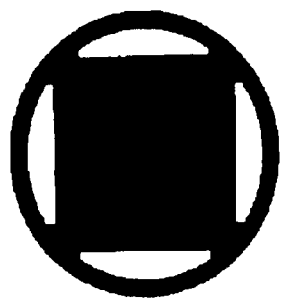

The desired contact-hole pattern 31 on the mask 300*a* shown in FIG. 14 has a hole diameter larger than the auxiliary pattern 32 and thus has stronger light intensity than the peripheral, forming the desired contact-hole pattern on the plate 500. However, as shown in FIGS. 18A and 18B, the mere cross oblique incidence illumination or illumination using only enhancement illumination part would result in the resolution of the auxiliary pattern on the plate 500 and creates an unnecessary pattern other than the desired contact-hole pattern. Here, FIG. 18 is a view of simulated resolved pattern on the plate 500 corresponding to the right effective light-source shape.

Figure 19:
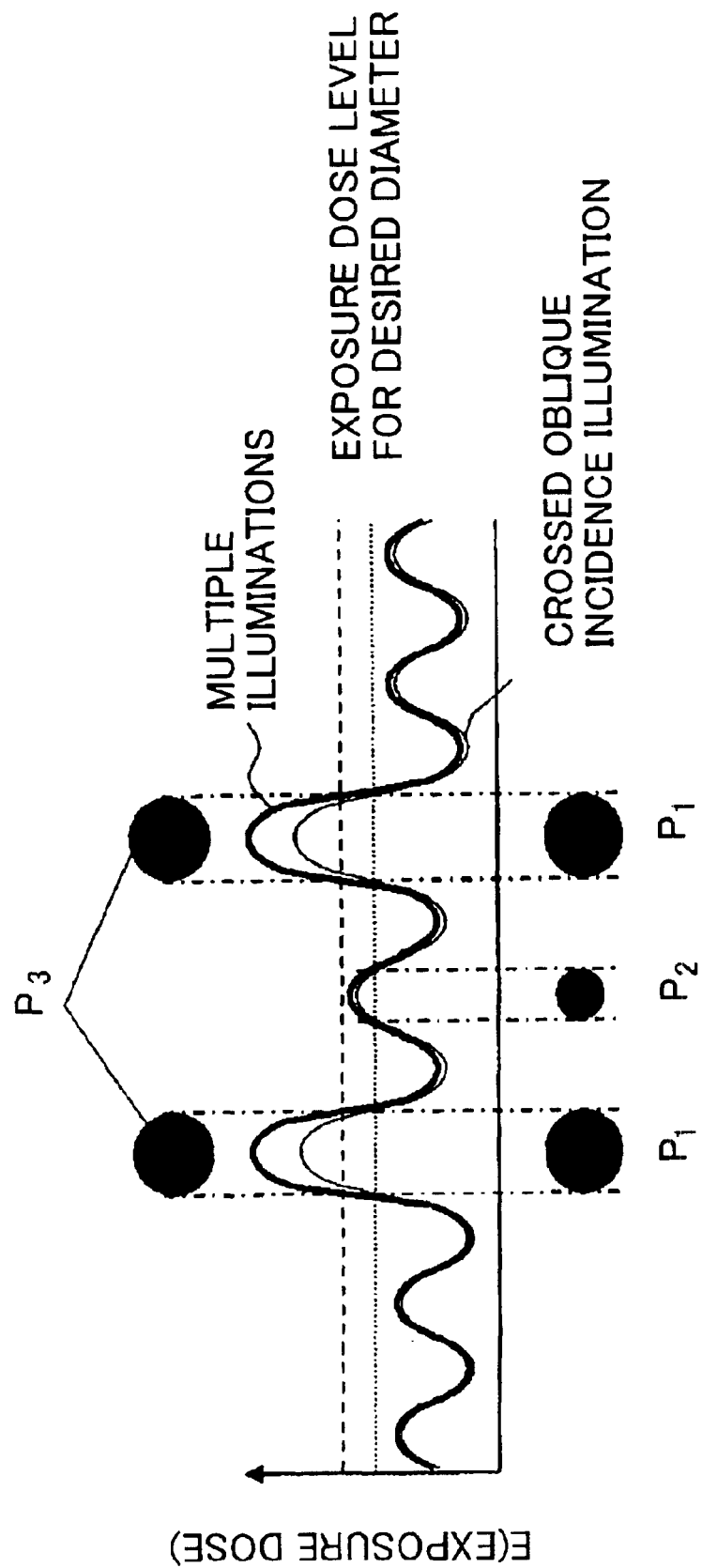
FIG. 19 is a view showing exposure dose in modified illumination and an image on the object to be exposed corresponding to the exposure dose.

As shown in FIG. 19, the exposure dose of a thin solid ray resolves not only the desired pattern P1 but also auxiliary pattern P2 when sliced at the exposure-dose threshold or resist threshold shown by a thin dotted line in FIG. 19 where the desired contact-hole pattern P1 has a desired diameter value. Here, FIG. 19 shows a relationship between the exposure dose and an image on the plate 500 corresponding to the exposure dose for the crossed oblique incidence illumination and inventive modified illumination.

Accordingly, the instant inventor has proposed to add the effective light-source distribution, i.e., the above restraint illumination part, which allows only one diffracted beam to enter the pupil surface, to the effective light-source distribution. Preferably, the diffracted beam is $0^{th}$ order diffracted light as the only one diffracted beam for a smaller oblique incident angle.

Figure 18C:
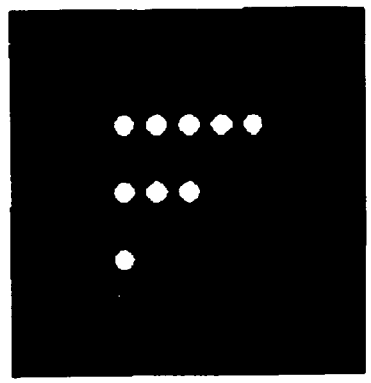
Figure 18C:
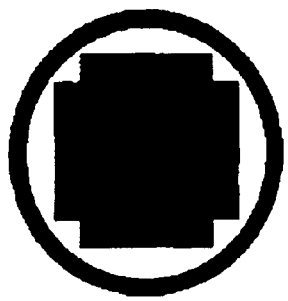
Figures 20A, 20B:
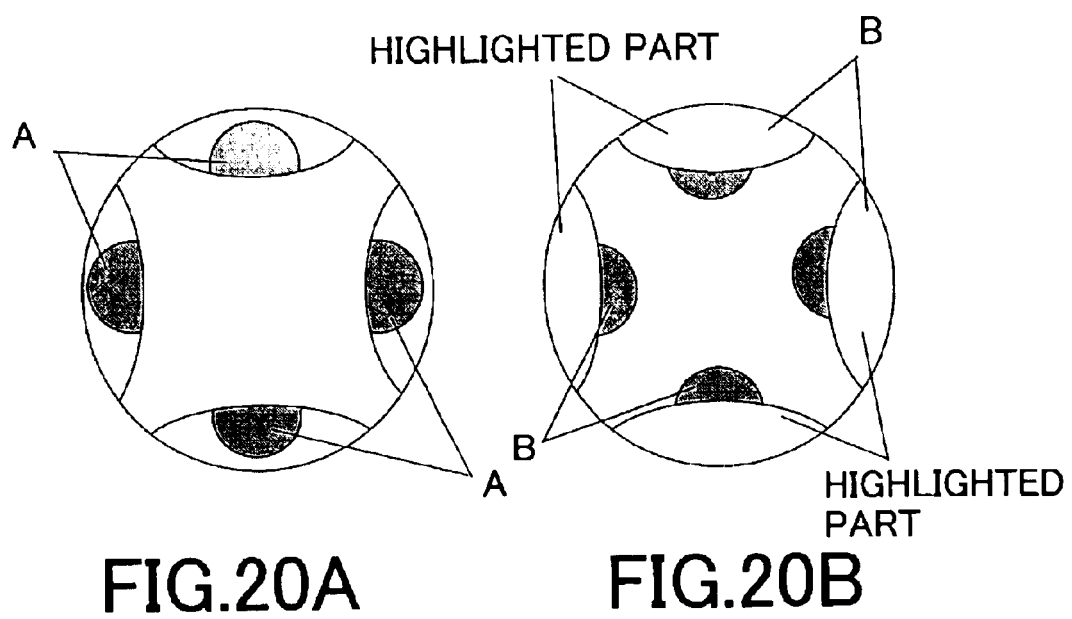
FIG. 20 is a schematic view for explaining an effective light-source distribution.
Figure 20C:
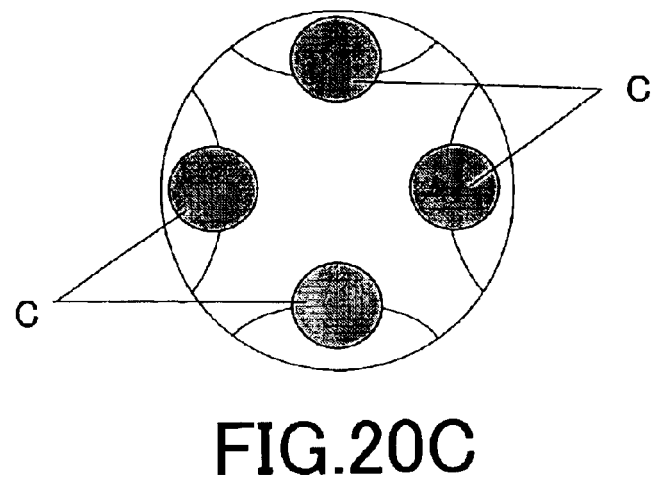

Thus, an illumination system provides modified illumination including effective light sources, such as drawn area C in FIG. 20C, which crosses each pole of the quadrupole over the enhancement and restraint illumination parts, as a sum of an effective light-source distribution or illumination using the enhancement illumination part (see drawn area A in FIG. 20A) that allows two diffracted beams to enter the pupil, and an effective light-source distribution or illumination using the restraint illumination part (see drawn area B in FIG. 20B) that allows one diffracted beam to enter the pupil. Understandably, this modified illumination having such an effective light-source distribution would resolve only a desired pattern on the plate 500 without the dummy resolution, as shown in FIG. 18C.

The exposure dose on the plate 500 shows like a thick solid ray shown in FIG. 19, and provides the desired pattern P3 in which the dummy resolution pattern P2 disappears at the exposure-dose threshold or resist threshold shown by a thick dotted line where the desired contact-hole pattern has a desired diameter value.

It is thus understood that the modified illumination having the effective light-source shape shown in FIG. 20C to the mask 300*a* shown in FIG. 14 increases resolving power for the contact-hole pattern.

As discussed, the interval La between two opposite distributions of the enhancement illumination parts requires a ratio of 0.32 or larger to the pupil diameter in the projection optical system 400. Preferably, the light quantity of the enhancement illumination part is larger than that of the restraint illumination part to resolve the desired pattern using the above effective light source. It is preferable that an interval between barycenters of two opposite distributions has a ratio 0.32 or larger to the pupil diameter. When the interval between the barycenters is excessively larger than the pupil diameter, the illumination light or $0^{th}$ order light itself is larger than the pupil diameter, causing the lowered light intensity, bad resolution, etc. Therefore, it is preferable that the interval between the barycenters to the pupil diameter is about 0.90 at most, and thus variable between about 0.32 and about 0.90.

The range of the enhancement illumination part depends upon a pattern pitch. A size of the auxiliary pattern changes the optimal ratio between the enhancement illumination light quantity and the restraint illumination light quantity.

The present invention may maintain the optimal illumination by varying an interval between the barycenters and a size of each pole in the quadrupole distribution as the pattern pitch and size of the auxiliary pattern change.

Turning back to FIG. 1, the mask 300 is made, for example, of quartz, which forms a circuit pattern or an image to be transferred, and is supported and driven by a mask stage (not shown). Diffracted light through the mask 300 is projected onto the plate 500 through the projection optical system 400. The mask 300 and plate 500 are arranged in a conjugate relationship. Since the exposure apparatus 100 according this embodiment is a so-called scanner, it transfers a mask pattern onto the plate 500 by synchronously scanning the mask 300 and plate 500.

The projection optical system 400 projects light from an object surface, i.e., the mask 300 onto an image surface, e.g., an object to be exposed or the plate 500. The projection optical system 400 may use an optical system solely composed of a plurality of lens elements, a catadioptric optical system comprised of a plurality of lens elements and at least one concave mirror, an optical system comprised of a plurality of lens elements and at least one diffraction optical element such as a kinoform, and a catoptric optical system including only mirrors, and so on. Any necessary correction of chromatic aberration may use a plurality of lens units made from glass materials having different dispersion values (Abbe values), or arrange a diffraction optical element such that it disperses in a direction opposite to that of the lens unit.

The plate 500 is a wafer in the instant embodiment, but it may include a liquid crystal plate and a wide range of other objects to be exposed. Photoresist is applied onto the plate 500. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photo resist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

The plate 500 is supported by the plate stage (not shown). The plate stage may use any structure known in the art, and thus a detailed description of its structure and operations is omitted. For example, the plate stage uses a linear motor to move the plate 500 in X-Y directions. The mask 300 and plate 500 are, for example, scanned synchronously, and the positions of the mask stage and plate stage (not shown) are monitored, for example, by a laser interferometer and the like, so that both are driven at a constant speed ratio. The plate stage is installed on a stage barrel stool supported on the floor and the like, for example, via a dumper, while the mask stage and the projection optical system 400 are installed on a stage barrel stool (not shown) supported by the base frame placed on the floor, for example, via a dumper.

In exposure, light emitted from the light source section 210 illuminates the mask 300 through the illumination optical system 220. The light that has passed and indicates the mask pattern forms an image on the plate 500 through the projection optical system 400.

The illumination optical system 200 used for the exposure apparatus 100 illuminates the mask 300 with an optimal illumination condition according to the desired pattern formed on the mask 300, providing devices (such as semiconductor devices, LCD devices, image pick-up devices (such as CCDs), and thin film magnetic heads) with high resolution, throughput and economical efficiency.

Figure 21:
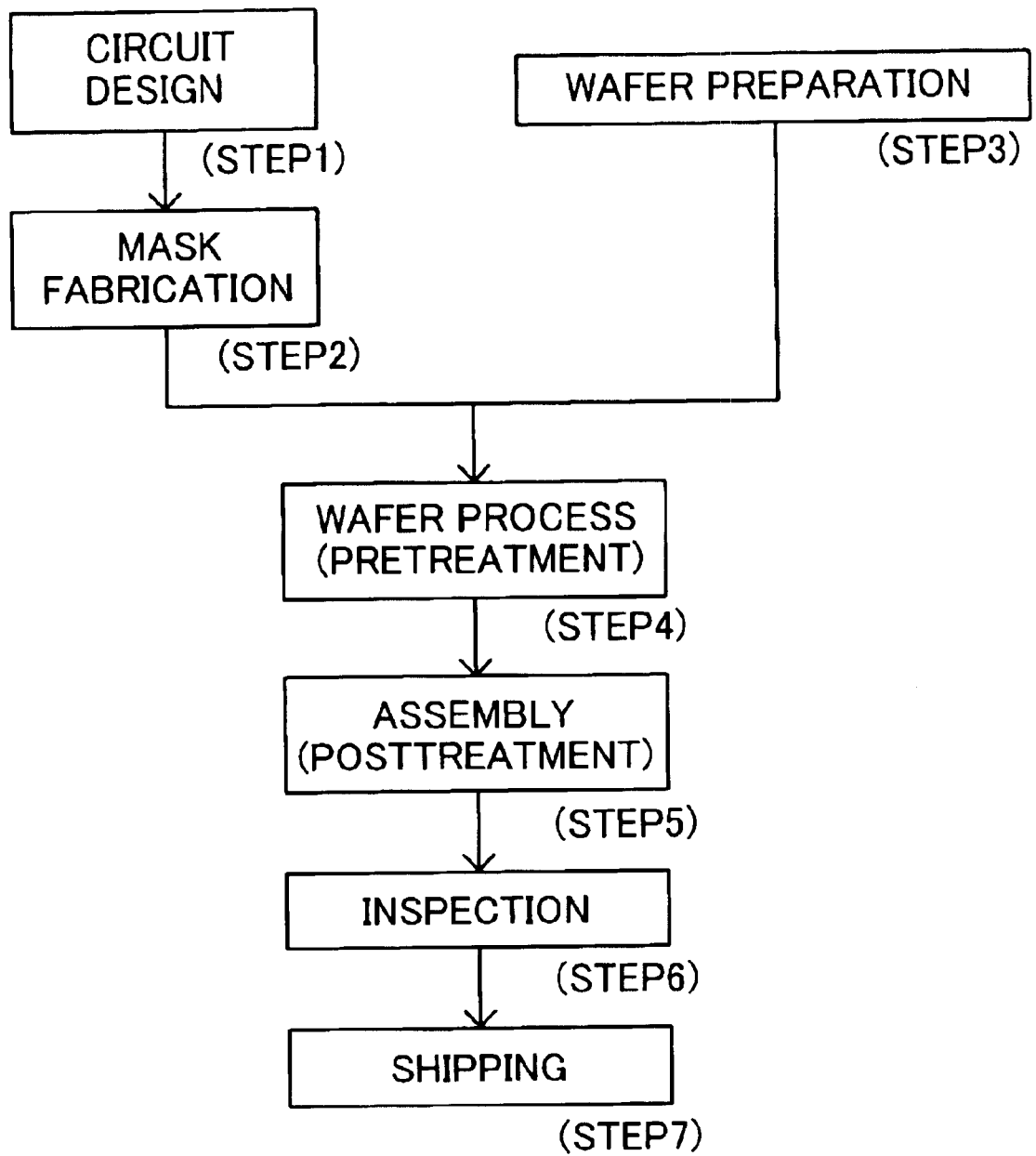
FIG. 21 is a flowchart for explaining how to fabricate devices (such as semiconductor chips such as ICs and LCDs, CCDs, and the like).
Figure 22:
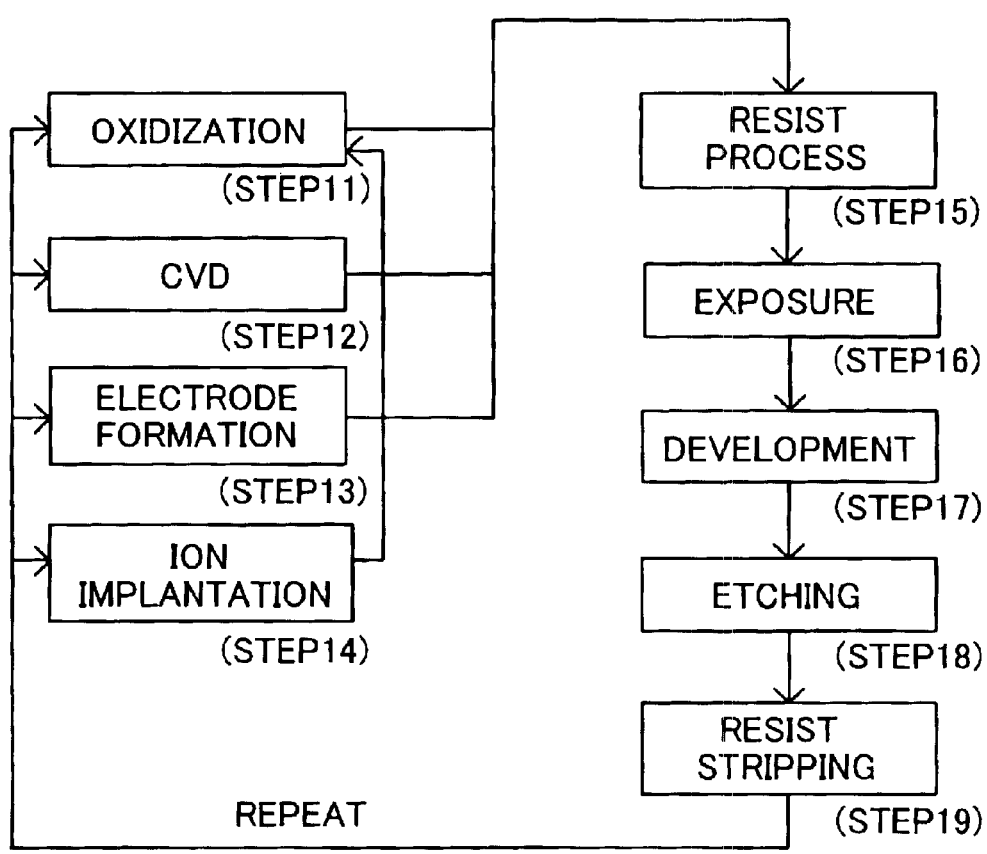
FIG. 22 is a detail flowchart of a wafer process as Step 4 shown in FIG. 21.

Referring now to FIGS. 21 and 22, a description will be given of an embodiment of a device fabricating method using the above exposure apparatus 100. FIG. 21 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 22 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one.

Further, the present invention is not limited to these preferred embodiments, and various variations and modifications may be made without departing from the scope of the present invention.

The inventive illumination optical system thus may provide an illumination optical system, as well as an exposure method and apparatus having the same, which may provide an optimal effective light-source area or illumination-light shape according to mask-pattern shapes, and relatively vary part of the effective light-source area.

What is claimed is:

1. An illumination optical system for illuminating a mask that arranges a contact-hole pattern and an auxiliary pattern smaller than the contact-hole pattern using light from a light source, said illumination optical system comprising:

an illumination-light generating mechanism for dividing the light and for forming a quadrupole light intensity distribution around an optical axis on a surface that has substantially a Fourier conversion relationship with the mask, so as to resolve the contact-hole pattern and restrain the auxiliary pattern from resolving, wherein at least one of a size of each pole in the quadrupole light intensity distribution and a distance between the optical axis and each pole in the quadrupole light intensity distribution are variable, and wherein the contact-hole pattern aligns with the auxiliary pattern on the mask in longitudinal and transverse directions, and each pole in the quadrupole light intensity distribution separates from the optical axis in the longitudinal and transverse directions.

2. An illumination optical system according to claim 1, wherein said illumination-light generating mechanism includes a prism.

3. An illumination optical system according to claim 2, wherein the prism includes pyramid surfaces that arrange a concave surface at an incident surface side and a convex surface at an exit surface side.

4. An illumination optical system according to claim 1, wherein the illumination-light generating mechanism includes a diffraction optical element.

5. An illumination optical system according to claim 1, wherein the illumination-light generating mechanism includes:

plural optical elements; and a switch mechanism for arranging each optical element on and retreating each optical element from a light path.

6. An illumination optical system according to claim 1, further comprising an illumination-light deforming mechanism for varying at least one of a size of each pole in the quadrupole light intensity distribution and a distance between the optical axis and each pole in the quadrupole light intensity distribution, wherein the illumination-light deforming mechanism includes plural lenses that have a variable magnification or focal distance.

7. An illumination optical system according to claim 1, further comprising an illumination-light deforming mechanism for varying at least one of a size of each pole in the quadrupole light intensity distribution and a distance between the optical axis and each pole in the quadrupole light intensity distribution, wherein the illumination-light deforming mechanism includes:

first and second optical members; and a drive mechanism for relatively moving the first and second optical members in an optical-axis direction.

8. An illumination optical system according to claim 7, wherein each of the first and second optical members is a prism.

9. An illumination optical system according to claim 1, wherein each pole in the quadrupole light intensity distribution has a variable shape.

10. An exposure apparatus comprising:

an illumination optical system for illuminating a mask using light from a light source, said mask arranging a contact-hole pattern and an auxiliary pattern smaller than the contact-hole pattern; and a projection optical system for projecting light from said illumination optical system onto an object to be exposed, wherein said illumination optical system includes an illumination-light generating mechanism for dividing the light and for forming a quadrupole light intensity distribution around an optical axis on a predetermined surface that has substantially a Fourier conversion relationship with the mask, so as to resolve the contact-hole pattern and restrain the auxiliary pattern from resolving, wherein at least one of a size of each pole in the quadrupole light intensity distribution and a distance between the optical axis and each pole in the quadrupole light intensity distribution are variable, and wherein the contact-hole pattern aligns with the auxiliary pattern on the mask in longitudinal and transverse directions, and each pole in the quadrupole light intensity distribution separates from the optical axis in the longitudinal and transverse directions.

11. A device fabricating method comprising the steps of:

exposing an object using an exposure apparatus; and performing a predetermined process for the object that has been exposed, wherein the exposure apparatus includes:

an illumination optical system for illuminating a mask using light from a light source, said mask arranging a contact-hole pattern and an auxiliary pattern smaller than the contact-hole pattern; and a projection optical system for projecting light from said illumination optical system onto an object to be exposed, wherein said illumination optical system includes an illumination-light generating mechanism for dividing the light and for forming a quadrupole light intensity distribution around an optical axis on a predetermined surface that has substantially a Fourier conversion relationship with the mask, so as to resolve the contact-hole pattern and restrain the auxiliary pattern from resolving, wherein at least one of a size of each pole in the quadrupole light intensity distribution and a distance between the optical axis and each pole in the quadrupole light intensity distribution are variable, and wherein the contact-hole pattern aligns with the auxiliary pattern on the mask in longitudinal and transverse directions, and each pole in the quadrupole light intensity distribution separates from the optical axis in the longitudinal and transverse directions.

* * * * *